United States Patent [19]

Selbrede

[11] Patent Number: 4,862,400

[45] Date of Patent: Aug. 29, 1989

[54] MICROCOMPUTER BUS ASSEMBLY

[76] Inventor: Martin G. Selbrede, 9205 Alabama Ave., Suite E, Chatsworth, Calif. 91311

[21] Appl. No.: 55,183

[22] Filed: May 28, 1987

[51] Int. Cl.[4] .............................................. H05K 7/74
[52] U.S. Cl. ..................................... 364/708; 361/415
[58] Field of Search ................. 364/708; 361/415, 399

[56] References Cited

U.S. PATENT DOCUMENTS

| | | | |
|---|---|---|---|
| 4,124,878 | 11/1978 | Ebner et al. | 361/415 |
| 4,319,305 | 3/1982 | Meldrum | 361/415 |
| 4,429,937 | 2/1984 | Stockmaster | 361/415 |
| 4,473,263 | 9/1984 | Sunstein | 361/415 |
| 4,505,394 | 3/1985 | Reimer | 361/415 |
| 4,745,524 | 5/1988 | Patton III | 364/708 |

Primary Examiner—David H. Malzahn

[57] ABSTRACT

A bus assembly for a microcomputer comprising a motherboard having a data bus of the standard type, which bus assembly comprises means for mounting a plurality of daughtercards at an acute angle with respect to the motherboard. The bus assembly further comprises a bus extension card adapted to plug into the edge card connectors of the motherboard data bus so as to be retained parallel to the motherboard. The bus extension card is provided with a plurality of edge card connectors disposed at an acute angle with respect to the card and thus at an acute angle with respect to the motherboard.

8 Claims, 4 Drawing Sheets

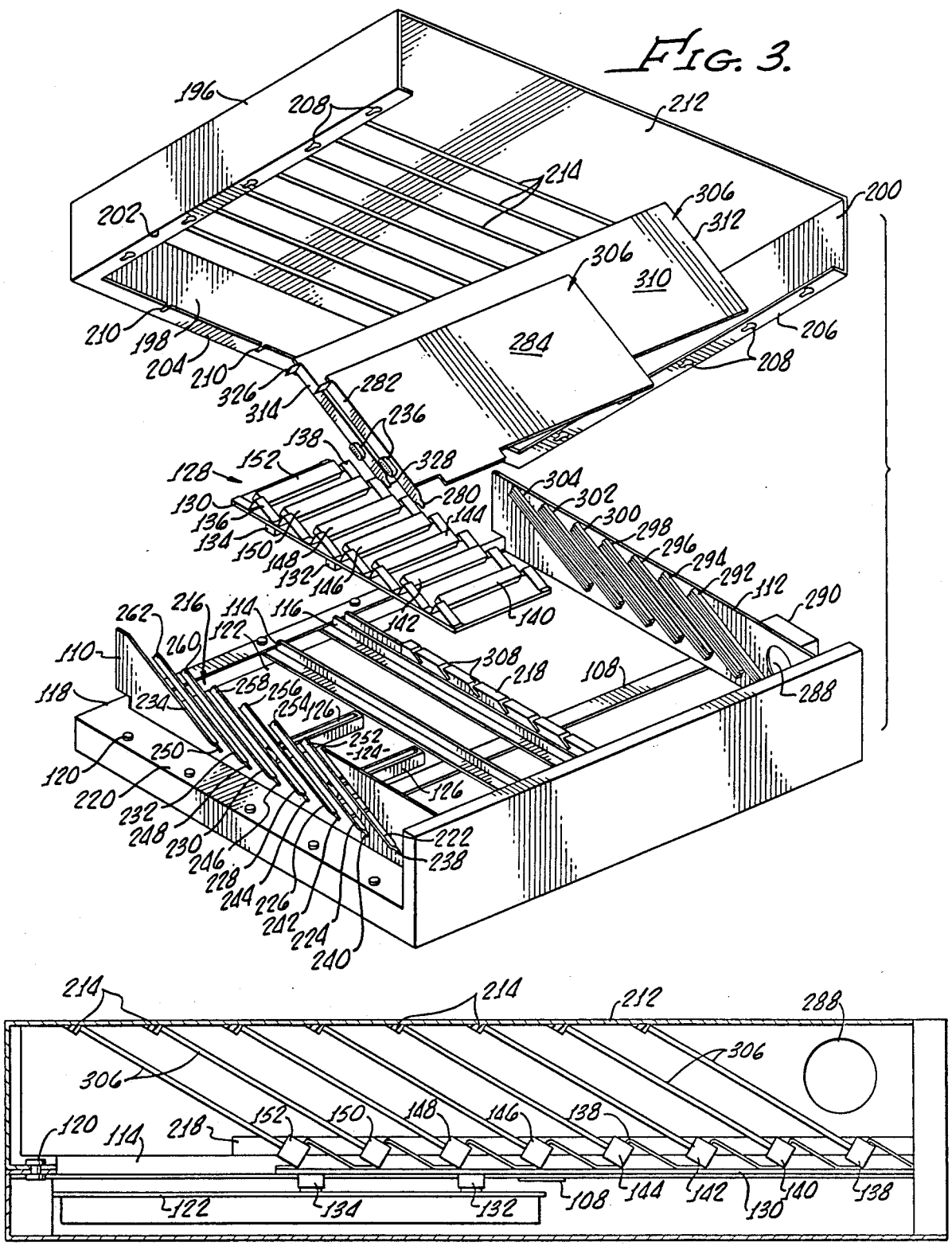

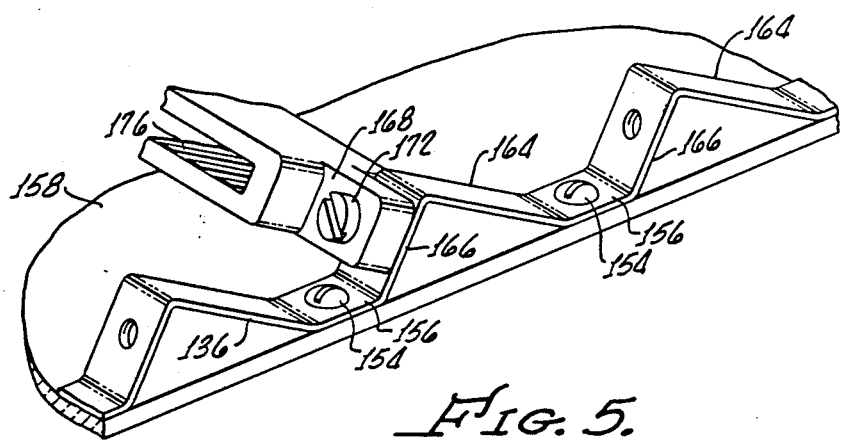
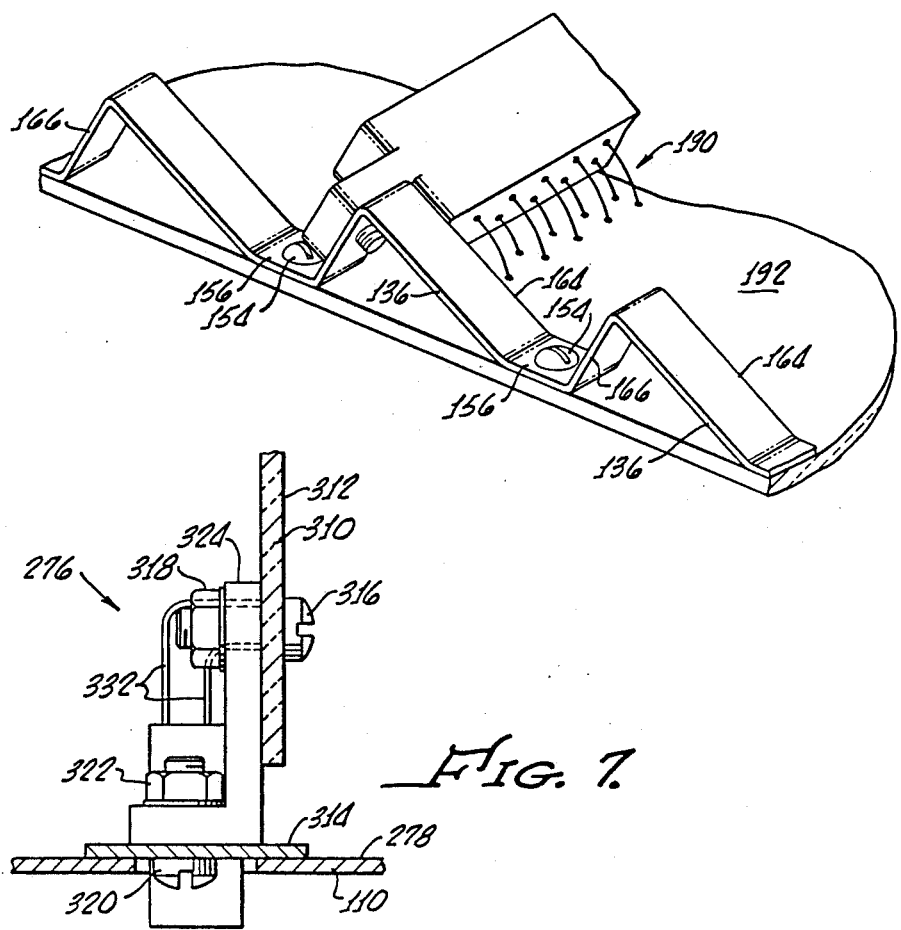

MICROCOMPUTER BUS ASSEMBLY

FIELD OF THE INVENTION

The invention relates to the field of microcomputer bus assemblies.

BACKGROUND OF THE INVENTION

In the standard microcomputer data bus configuration, daughtercards are inserted into edge card connectors that allow for a mounting angle perpendicular to the plane of the motherboard. Whereas this configuration makes the most efficient use of space in a direction parallel to the plane of the motherboard and perpendicular to the faces of the daughtercards, it unfortunately maximizes the chassis dimension normal to the plane of the motherboard. In desktop computer designs, this represents no serious liability, since the chassis can be configured to accommodate this inherent bus characteristic simply by extending the height of the chassis as required. In a portable computer, however, since space is at a premium, an entirely new bus configuration is required to reduce the height of the chassis while yet maintaining reasonable inter-daughtercard distributions. Such a design would have the effect of reducing the thickness of a portable computer between 1½ to 2 inches without recourse to eliminating daughtercards, the only viable alternative known to the prior art.

Rather than mount the daughtercards perpendicular to the motherboard, or horizontally across the board (resulting in serious heat dissipation problems, let alone bus transmission difficulties related to inordinate extension of the data path), the present invention comprises a daughtercard mounting configuration designed around an angular mounting geometry, one that permits the daughtercards to be securely mounted at a 30-degree angle up from the plane of the motherboard. An extension bus, in conjunction with the angular geometry of the card frame, permits a significant reduction in the overall thickness of a portable computer.

BRIEF SUMMARY OF THE INVENTION

The present invention is a bus assembly for a microcomputer which includes a motherboard having a data bus of the standard type, such as is found on computers compatible with, for example, the IBM PC-XT and IBM PC-AT computers. The improved bus assembly of the present invention comprises mounting means for mounting at least one daughtercard at an acute angle from the motherboard. More particularly, the bus assembly of the present invention comprises mounting means which includes edge card connectors with a pair of mounting ears, a pair of ladder members adapted to engage said ears so as rigidly to retain and support said edge card connectors, and said present invention also comprises a bus extension adapted to engage two of the standard, integral motherboard edge card connectors, and also to rigidly support said ladder members and edge card connectors.

Implementation of the proposed angular geometry, heretofore described in terms of edge card connectors not directly contacting the motherboard but rather mounted on an intervening member, can also be executed in a direct-mount setting. This proposed second embodiment is predicated on a re-design of the edge card connectors proper, whereby the requisite angle mount is incorporated into the revised edge card connector configuration. In order to maximize the "footprint" (contact plane) between edge card connector and motherboard (and hence maximize mechanical stability during insertion and extraction of daughtercards), the cross-section of the revised edge card connector would be distinctly triangular. The connector, conceived three-dimensionally, is prismatic, with the solder posts extending vertically downward to mate with the motherboard post holes. In contrast to the connectors utilized in the first embodiment, the revised on-board connectors will omit integrated mounting ears on the distal portions. Such ears are required in the first embodiment to relieve all mechanical stress on the relatively delicate and exposed, curved solder posts. However, an on-board connector distributes mechanical stress along the entire contact plane, which is capable of sustaining tremendous downward mechanical stresses. Upward forces due to daughtercard extraction are distributively absorbed by the 62 solder connections capturing the connector from the underside of the motherboard. Since insertion and extraction force vectors necessarily lie along the axis of the daughtercards, and are not normal to the plane of the motherboard, the force resolves into vertical and horizontal components, the vertical component approximately having in magnitude due to the geometry of the configuration. This enhances the stability of the connector design. The horizontal component constitutes a sheering effect on the solder posts that is minimized by the virtual non-existence of a torque arm by virtue of the direct contact of the connector with the motherboard. Mechanical failure of all 62 solder posts due to horizontal shearing would require prohibitively large and unnecessary insertion forces (generally greater than a human would be capable of applying), and is thus not considered a real-world liability of the proposed design.

A further advantage of the second embodiment is that it further minimizes composite depth in relation to the first embodiment. This naturally results from the omission of the intervening member and its associated mean depth. The disadvantage of the second embodiment is of a trigonometric nature relating to the spacing of the edge card connector holes on the motherboard. The first embodiment allows utilization of existing motherboards without major modification, allowing a modularity of approach. The second embodiment requires the re-design of the target motherboards, increasing the spacing between the edge card connector mounting positions, as is incorporated in the first embodiment's intervening member. Failure to do so will significantly decrease board-to-board clearance between inserted daughtercards. This embodiment of the invention realizes the greatest possible gain in total computer depth while retaining all the desirable thermal and mechanical properties of the first embodiment.

BRIEF DESCRIPTION OF THE DRAWINGS

FIG. 3 is an exploded perspective view of the microcomputer chassis of the present invention;

FIG. 4 is a cross-sectional view of the microcomputer chassis taken along the line 4—4 shown in FIG. 1;

FIG. 5 is a detailed perspective of a ladder member and an edge card connector of the present invention;

FIG. 6 is a another detailed perspective of a ladder member and an edge card connector of the present invention;

FIG. 7 is a cross-sectional view of a daughtercard of the present invention taken along the line 7—7 shown in FIG. 2.

DETAILED DESCRIPTION

Figure 1:
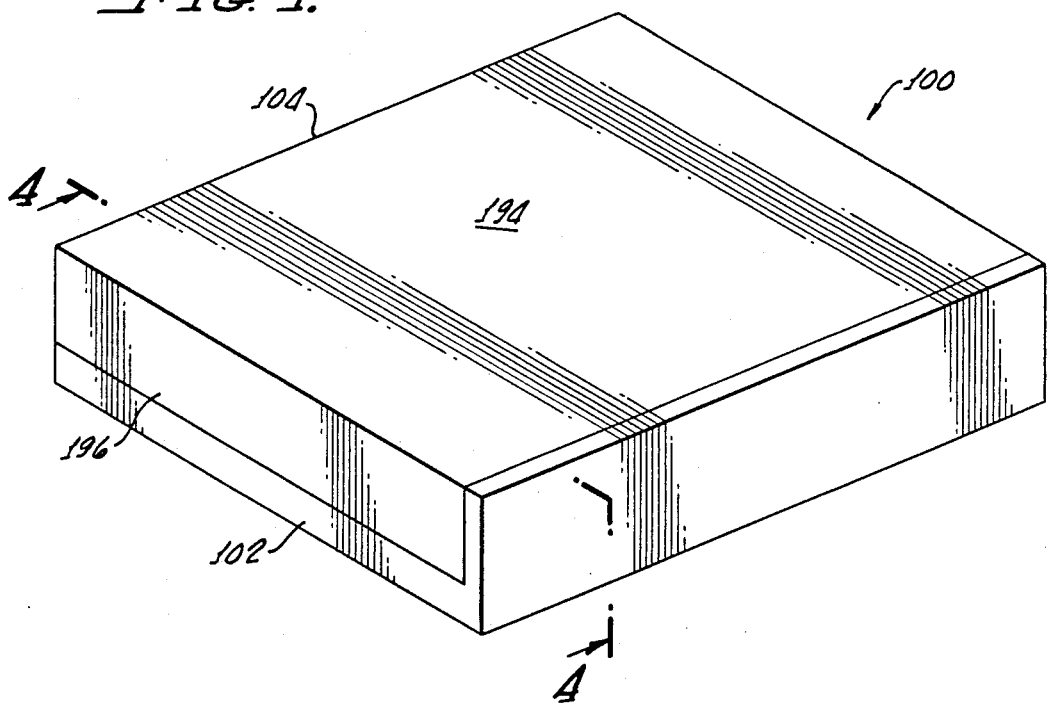
FIG. 1 is a perspective view of a microcomputer chassis of the present invention.

With reference primarily to FIGS. 1 through 4, there is shown a microcomputer console indicated generally by reference numeral 100. The console 100 comprises in turn a chassis 102 and a detachable cover 104. Throughout this Detailed Description, the terms top, bottom, upper, lower, etc., will have the directional meanings assigned them in FIG. 1, though it should be understood that the portable computer of the present invention is intended for use both in a horizontal and a vertical orientation.

The chassis 102 comprises a rigid, rectangular, metal frame 106. The frame 106 can be fashioned in various well-known manners. However, in a preferred embodiment of the present invention it is contemplated that the frame 106 be formed of four lengths of titanium joined by well known means to form a rigid rectangular frame. The frame 106 also includes a transverse support strut 108 for added rigidity.

Integral to the frame 106 are four rigid titanium members: a cardframe access plate 110, a cardframe restraining plate 112, an L-shaped strut 114 disposed parallel to and in spaced-apart relationship with the cardframe plates 110 and 112, and a U-shaped channel 116, also disposed parallel to and in spaced-apart relationship with the cardframe plates 110 and 112. The upper, outer surfaces 118 of the frame 106 are provided with spaced-apart, vertical pilot pins indicated generally by reference numeral 120.

Figure 2:
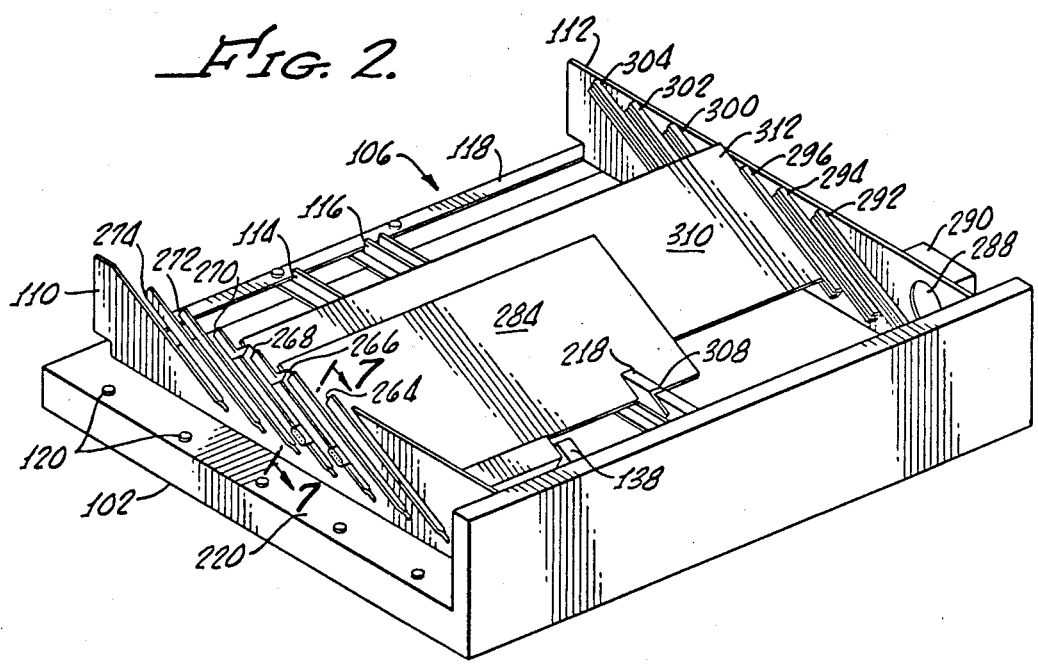
FIG. 2 is a perspective view of the microcomputer chassis of the present invention with the cover removed.

As most clearly shown in FIGS. 2 and 4, the chassis 102 also includes a standard microcomputer motherboard 122. The motherboard 122 is rigidly attached to the chassis 102 such that the plane of the motherboard 122 is parallel to the plane of the chassis 102. The motherboard 122 is rigidly attached to the chassis 102 by means of any suitable fastening means such as are known in the prior art. The motherboard 122 also includes a standard data bus, indicated generally by reference numeral 124, and standard daughtercard edge card connectors 126, commonly denominated in the art as sockets J1 through J8.

Turning chiefly to FIG. 3, there is shown an extension bus 128 of the present invention. The extension bus 128 comprises a PCB card 130 as is well known in the art, two DIN connectors 132 and 134 suitable to slidably engage sockets J1 and J8 of the motherboard, two ladder members 136 and 138, and a multiplicity (seven in the preferred embodiment) of edge card connectors 140 through 152, inclusive.

The ladder members 136 and 138 are rigidly secured to opposite edges of the card 130 by screws 154, although it should be understood that any well-known means of rigidly affixing the ladder members 136 and 138 to the card 130 would be acceptable. The ladder members 136 and 138 are formed of rigid metal, titanium in the preferred embodiment. The ladder members 136 and 138 are of serpentine shape, with flat, horizontal portions 156 adapted to abut the opposite longitudinal edges of the upper surface 158 of the card 130 with sufficient surface to provide holes 160 through which screws 162 can be driven to affix the ladder members 136 and 138 to the card 130. The ladder members 136 and 138 are shaped such that each iterative portion thereof comprises a gently angled portion 164, a sharply angled portion 166, and a flat portion 156. The sharply angled portions 166 are angled from the vertical at 60 degrees in the preferred embodiment.

The card 130 also includes a multiplicity of 62-pin edge card connectors 140-152. In the preferred embodiment as herein described, there are seven of such edge card connectors. Each edge card connector 140-152 is adapted to receive a standard daughtercard edge card connecting tab. For ease of description, the following discussion will focus on one of the edge card connectors. Unlike prior art edge card connectors, the edge card connector 140 of the present invention includes a pair of ears 168 and 170 disposed on opposite sides thereof, and formed integral therewith. Each of the ears 168 and 170 is bored so as to receive respective ones of mounting screws 172 and 174. In operation, the edge card connectors 140-152 are rigidly connected to the ladder members 136 and 138 by way of screws 154, such that the slots 176-188 of the edge card connectors 140-152 are disposed at a 30-degree angle from the motherboard 122. The 62 connectors, shown representatively at 190, of each edge card connector 140-152, respectively, are each soldered (see FIG. 6) to respective lines of a data bus 192 of the extension bus 128.

The cover 104 of the console 100 is comprised of an open-ended, box-shaped piece of rigid metal, which in the present embodiment is a unitary piece of titanium. More specifically, the cover 104 includes a flat, horizontal surface member 194 from which depend on three sides vertical surface members 196, 198, and 200. Each of the vertical surface members 196-200 includes a respective inward-pointing lip 202, 204 and 206. The lips 202 and 206 of respective side vertical surface members 196 and 200 are provided with key-slots 208 adapted slidably to receive respective pilot pins 120. The lip 204 of the back vertical surface member 198 is provided with open slots 210 to slidably receive corresponding pilot pins 120.

The underside of the horizontal surface member 194 of the cover 104 also includes compression means 214. The compression means 214 are, in the preferred embodiment, strips of resilient material mounted transversely across the underside of the cover 104.

With reference again chiefly to FIGS. 2 through 4, it can be seen that the chassis 102 includes daughtercard mounting means, which means is indicated generally by reference numeral 216. The mounting means 216 further comprises cardframe access plate 110, nylon strip 218, cardframe restraining plate 112, and the edge card connector slots 176-188 (as described hereinabove).

The cardframe access plate 110 is a vertically disposed, rigid metal, preferrably titanium, rectangular plate, which is integral to, and in an upright position with respect to, the frame 106. In the preferred embodiment of the present invention, it is contemplated that the cardframe access plate 110 will be provided with a longitudinally-extending lip 220 along its bottom edge. The lip 220 includes pilot pins 120 (as already described) disposed in spaced-apart manner along its length. The cardframe access plate 110 is provided with a series of spaced apart, diagonal access slots 222-234 - in the preferred embodiment, seven in number, each at 30 degrees from the plane of the motherboard 122. The slots 222–234 are adapted to slidably receive standard prior-art daughtercard connectors such as are indicated at 236 (as more fully discussed below). The slots include nipple-shaped necks 238–250 at their lower extremities (as viewed in FIG. 2). The necks 238–250 are of smaller cross-section than are the slots proper. The necks 238–250 are adapted to slidably receive daughtercard hardware of a standard prior-art variety. The slots 222–234 are defined by diagonal spokes 252–262 of the cardframe access plate 110. Each spoke 252–262 includes a respective terminus 264–274 which is simply an angle-cut at right angles to the longitudinal axes of the spokes 252–262.

The cardframe access plate 110 includes daughtercard grounding means indicated generally by reference numeral 276. The daughtercard grounding means 276 comprises the cardframe access plate 110 itself as well as well-known female tab receiving means (not shown) rigidly connected to the inner vertical surface 278 of the cardframe access plate 110 along the bottom edge thereof. The receiving means is adapted to slidably receive a tab 280 of a grounding plate 282 of a daughtercard 284.

Cardframe restraining plate 112 is substantially a mirror-image of the cardframe access plate 110, with the exception that it is solid rather than containing such slots as slots 222–234 of the cardframe access plate 110. The cardframe restraining plate 112 is disposed on the right (as viewed in FIG. 2) side of the frame 106 in spaced-apart relationship with cardframe access plate 110. The cardframe restraining plate 112 is a vertically disposed, rigid metal, preferrably titanium, rectangular plate, which is rigidly affixed in an upright position to the frame 106. In the preferred embodiment of the present invention, it is contemplated that the cardframe restraining plate 112 will be provided with a longitudinally-extending lip 286 along its bottom edge (see, for instance, FIG. 4). The lip 286 includes pilot pins 120 disposed in spaced-apart manner along its length. The cardframe restraining plate 112 also includes a circular port 288, of the well-known type, for drawing air out by way of an exhaust fan, such as is represented schematically at reference numeral 290. The cardframe restraining plate 112 further includes a series of diagonally disposed, spaced apart, standard, injection-molded, PCB daughtercard restraints 292–304. The restraints 292–304 are adapted to slidably receive and resiliently restrain the free ends 306 of standard configuration daughtercards. The restraints 292–304 define, along with the corresponding slots 222–234 of the cardframe access plate 110, seven parallel planes.

The daughtercard mounting means additionally comprises the nylon strip 218. The nylon strip 218 is retainably disposed within the U-shaped channel 116. The nylon strip 218 is formed, in the preferred embodiment, of a unitary piece of nylon such as is commonly available. The nylon strip 218 is provided with a series of spaced apart, angled notches 308 of sufficient width to slidably but firmly receive and retain the edge of a standard daughtercard. The notches 308 are disposed on the respective planes defined (as discussed above) by respective corresponding slots 222–234 of the cardframe access plate 110 and restraints 292–304 of the cardframe restraining plate 112.

Installation of a Standard-Size Daughtercard

In order more completely to understand the usefulness of the present invention, reference should be had to FIGS. 3 and 7, wherein are shown daughtercards 284 and 310 such as are well known in the art. In particular, the daughtercards 284 and 310 are of standard type such as are compatible with IBM personal computers and computers which are compatible therewith. Thus, the daughtercard 310 comprises a PCB card 312 containing electronic circuitry to which is rigidly affixed installation hardware comprising a grounding plate 314, a bolt 316 and its associated nut 318, a bolt 320 and its associated nut 320, and an angle bracket 324.

The angle bracket 324 is formed of a longitudinally extending, L-shaped strip of rigid conductive metal. The angle bracket 324 is rigidly attached to the daughtercard 310 by one or more fasteners such as the bolt 316 and nut 318. The other outward-facing surface of the angle bracket 324 is rigidly attached to the grounding plate 314 by one or more fasteners such as the bolt 320 and nut 322.

The grounding plate 314 is formed of a flat, longitudinally extending strip of rigid conductive metal. The grounding plate 314 is provided at its upper extremity with a flange 326 which flange 326 extends outward (with reference to the chassis 102) in a direction normal to the plane of the central portion of the grounding plate 314. The grounding plate 314 is provided at its lower extremity with a flat, nipple-shaped tab 328 formed integrally with the rigid conductive metal of the grounding plate 314. The grounding plate 314 is also provided with a standard female connector 330 adapted to slidably receive a corresponding male connector of a peripheral device (not shown). The connector 330 is electrically connected to the circuitry of the daughtercard 310 by a multiplicity of wires indicated collectively by reference numeral 332. The daughtercard 310 further comprises an edge card connecting tab 334, generally formed integrally with the PCB card stock of the daughtercard 310 and extending downward from the lower edge thereof. Said tab 334 contains electrical connectors in the well-known manner.

Installation of a standard- or full-length daughtercard into a microcomputer of the present invention takes place as follows. The operator substantially simultaneously inserts (i) the metal tab 328 into the grounding slot (not shown), (ii) the edge card connecting tab 334 of the daughtercard 310 into the respective edge card connector, and (iii) the lower edge of the daughtercard 310 into the corresponding notch 308 of the nylon strip 218. Pressure is then applied in a direction parallel to the plane of the edge card connector until the daughtercard 310 is firmly seated in both the grounding slot and the edge card connector. The flange 326 of the daughtercard 310 will then be in grounding contact with the respective spoke terminus of the cardframe access plate 110. The cover 104 of the chassis 102 is then replaced, and the compression means 204 included in the cover 104 will apply resilient pressure to ensure that the daughtercard 310 remains properly and snugly seated during operation of the microcomputer. It has been found that the captivating pressure applied by the compression means is approximately equivalent to the restraining force provided by a standard screw fitting that engages the flange 326 in prior art devices.

Grounding of the daughtercard will be ensured by the planar pressure of the outer surface of the grounding plate 314 of the daughtercard 310 against the inner surface of the cardframe access plate 110; the contact of the tab 328 of the daughtercard 310 with the grounding slot (not shown) of the cardframe access plate 110; and the contact of the underside of the flange 326 of the daughtercard 310 with the respective spoke terminus of the cardframe access plate 110.

Installation of a Shorter Daughtercard

Installation of a shorter-length daughtercard takes place essentially as discussed above. However, since the shorter-size cards are not long enough to take advantage of the resilient restraints 292–304 provided in the inside surface of the cardframe restraining plate 112, they will be secured in position solely by the grounding slot (not shown), the respective edge card connector firmly engaging the respective edge card connecting tab, the respective nylon strip notch slidably and snugly engaging the lower edge of the daughtercard, and the compression means 214 of the cover 104 of the chassis 102 resiliently urging the daughtercard into firm engagement with the foregoing connecting means.

Alternative Embodiment

Figure 8:
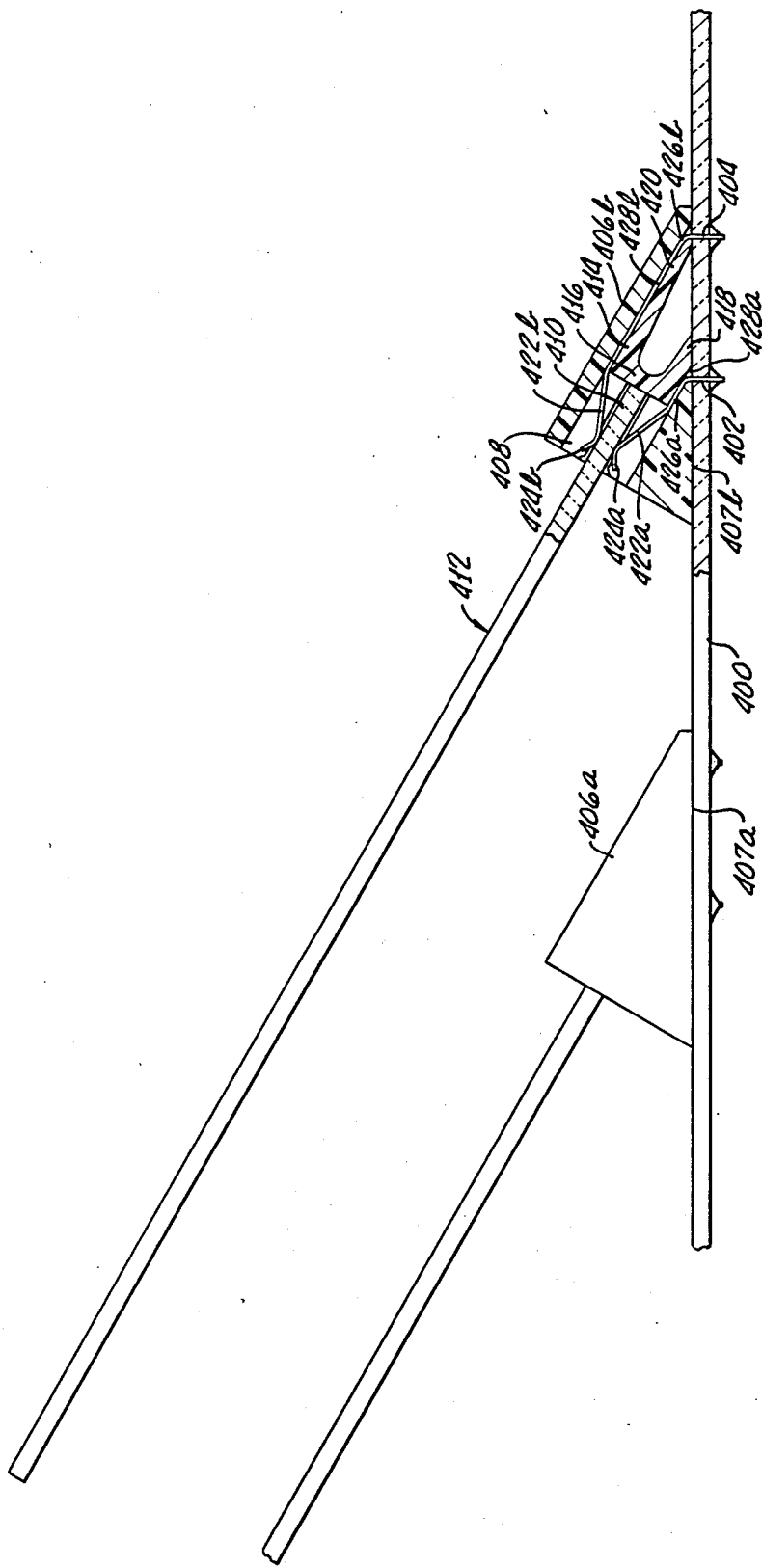
FIG. 8 is an orthogonal view of an alternative embodiment of the edge card connectors of the present invention.

Shown in FIG. 8 is an alternative embodiment of the present invention. More particularly, there is shown a portion of an improved motherboard 400, formed, as is standard, of PCB stock and provided with a plurality of solder post holes, two of which are indicated by reference numerals 402 and 404. Not shown are the standard electrical features common to computer motherboards.

A pair of edge card connectors 406a and 406b (shown by way of representation of what is generally a larger number of such connectors) of an alternative embodiment are rigidly disposed on the motherboard 400. Edge card connector 406b is shown in cross-section. Both connectors 406a and 406b are precisely the same in mechanical and electrical construction, however. The edge card connectors 406a and 406b are formed of polymer into a configuration that is prismatic in shape. From the orthogonal view of FIG. 8, the edge card connectors 406a and 406b are seen to be essentially triangular. Not shown in FIG. 8, because substantially as shown in previous figures and as is otherwise standard in the art, the edge card connectors extend longitudinally in a standard manner, sufficient to accommodate two rows of 31 solder posts each. The prismatic shape of the edge card connectors 406a and 406b provides a large "footprint," or contact plane, indicated by reference numerals 407a and 407b, respectively, between the edge card connectors 406a and 406b and the flat upper surface of the motherboard 400.

Because both edge card connectors 406a and 406b are of identical structure, the discussion will turn to a more precise description solely of the edge card connector 406b by way of illustration of this alternative embodiment of the present invention. Thus, as is standard in the art, the edge card connector 406b is provided with an interior, longitudinally extending slot 408 adapted slidably to receive an edge card connecting tab 410 of a daughtercard 412. Interior to the slot 408 is a plug 414, formed likewise of polymer. The plug 414 extends the length of the slot 408, and is provided with a transverse member 416 adapted to abut the edge card connecting tab 410, leg member 418 and leg member 420. The two leg members 418 and 420 are formed of diferent lengths so as to accommodate the slant of the daughtercard 412 and the slot 408.

The edge card connector 406b is also provided with solder posts 422a and 422b. Integral therewith and disposed at the top, or outer ends thereof, are curved, resilient spring portions 424a and 424b, respectively. The spring portions 424a and 424b are adapted to slidably receive and retain the edge card connecting tab 410, to center the edge card connecting tab 410 within the slot 408, and to provide electrical connection thereto in the well-known manner. The lower portions of the solder posts 422a and 422b extend downward through the edge card connector 406b, between the inner walls thereof and the leg members 418 and 420 of the plug 414, via recesses 228a and 228b, and which extend downward through post holes 402 and 404, respectively. On the back, or bottom side, of the motherboard 400, solder has been applied to each of the solder posts 422a and 422b to hold them, and thus the edge card connector 406b, rigidly in place. As can be clearly seen, the entire construction of the edge card connector 406b is adapted to dispose the edge card connecting slot thereof at a 30-degree angle from the motherboard 400, thus ensuring that the daughtercard 412 is likewise disposed at a 30-degree angle from the motherboard 400.

What is claimed is:

1. In a microcomputer which includes a chassis, a motherboard rigidly attached to said chassis, which motherboard includes an integral data bus and two edge card connectors rigidly disposed on said motherboard, daughtercard mounting means comprising:
   a flat bus extension card;
   means mounted on said bus extension card to engage said edge card connectors of said motherboard so as to retain said bus extension card parallel to said motherboard; and
   a multiplicity of edge card connectors disposed on said bus extension card, which edge card connectors include slots formed to slidably receive and resiliently retain daughtercard connecting tabs, which slots are disposed at an acute angle in relation to said bus extension card.

2. The daughtercard mounting means of claim 1 in which said bus extension card further comprises a pair of ladder members comprising respective parallel, stepwise strips of metal rigidly mounted to opposite sides of said bus extension card and rigidly connected to said edge card connectors mounted on said bus extension card.

3. The daughtercard mounting means of claim 1 in which said edge card connectors disposed on said bus extension card comprise means to slidably receive a connecting tab of a daughtercard, a pair of spaced-apart ears rigidly mounted on each of said edge card connectors disposed on said bus extension card, and means for rigidly attaching said ears to said bus extension card.

4. The daughtercard mounting means of claim 3 in which said means for rigidly attaching said ears to said bus extension card comprises a pair of ladder members rigidly attached to said bus extension card along the longitudinal edges thereof, which ladder members are adapted to abut said ears.

5. In a computer which includes a rigid chassis, a motherboard rigidly attached to said chassis, which motherboard includes a plurality of edge card connectors, a computer bus assembly comprising a bus extension card which includes means rigidly disposed on one surface of said bus extension card to electrically and retainably engage at least two of said edge card connectors of said motherboard, an edge card connector rigidly disposed on the other surface of said bus extension card in electrical connection with said means to engage at least two of said edge card connectors of said motherboard, and means for disposing said edge card connector at an acute angle with respect to said bus extension card.

6. In a microcomputer which includes a chassis, which chassis includes a pair of rigid, vertical, spaced-apart cardframe retaining plates, a motherboard rigidly attached to said chassis, which motherboard includes a data bus and at least two edge card connectors disposed normally to the surface of said motherboard, a daughtercard which includes an edge card connecting tab and a metal grounding tab, a microcomputer bus assembly comprising:

a rigid bus extension card;

a pair of parallel ladder members rigidly mounted on opposite longitudinal edges of the upper surface of said bus extension card, which ladder members comprise edge card connector retaining portions angled at approximately 60 degrees from the surface of said bus extension card;

a plurality of edge card connectors, each of which edge card connectors includes a slot adapted slidably to receive daughtercard edge card connecting tabs so as to make electrical contact, and a pair of mounting ears rigidly disposed on opposite longitudinal sides of said slot, said mounting ears being adapted to abut corresponding retaining portions of said ladder members;

means for rigidly attaching each of said mounting ears to a corresponding retaining portion of said ladder members;

daughtercard support means comprising a nylon strip disposed parallel to and in spaced-apart relationship from said cardframe retaining plates, said nylon strip including a plurality of notches adapted to slidably engage an edge of a daughtercard, and a plurality of daughtercard restraints disposed on one of said cardframe restraining plates, said daughtercard restraints being adapted to slidably engage an edge of a daughtercard.

7. A method of mounting a daughtercard in a microcomputer chassis, said method comprising:
 (a) mounting an edge card connector on the top surface of a rigid PCB card at an acute angle thereto;
 (b) mounting a pair of DIN connectors on the lower surface of said card so as to be in electrical contact with said edge card connector on the top surface of said card;
 (c) slidably engaging said DIN connectors into edge card connectors disposed on a motherboard.

8. In a computer which includes a rigid chassis, a motherboard rigidly attached to said chassis, which motherboard includes a data bus and a plurality of edge card connectors in electrical connection therewith, a daughtercard comprising an edge card connecting tab integral to said daughtercard, a bus assembly comprising a bus extension card comprising means on the lower surface of said bus extension card for slidably engaging said edge card connectors of said motherboard, a plurality of edge card connectors disposed on the upper surface of said bus extension card, means for rigidly retaining said edge card connectors on said bus extension card and for disposing said edge card connectors on said bus extension card at an acute angle with respect to said bus extension card.

* * * * *